(12) United States Patent
Scholl et al.

(10) Patent No.: US 6,222,321 B1
(45) Date of Patent: *Apr. 24, 2001

(54) PLASMA GENERATOR PULSED DIRECT CURRENT SUPPLY IN A BRIDGE CONFIGURATION

(75) Inventors: Richard A. Scholl; David J. Christie, both of Fort Collins, CO (US)

(73) Assignee: Advanced Energy Industries, Inc.

( * ) Notice: Subject to any disclaimer, the term of this patent is extended or adjusted under 35 U.S.C. 154(b) by 0 days.

This patent is subject to a terminal disclaimer.

(21) Appl. No.: 09/328,175

(22) Filed: Jun. 8, 1999

Related U.S. Application Data

(63) Continuation of application No. 08/646,616, filed on May 8, 1996, now Pat. No. 5,917,286.

(51) Int. Cl.[7] ........................................................ H05H 1/48
(52) U.S. Cl. .................................. 315/111.21; 118/723 E; 204/298.09
(58) Field of Search ..................... 315/111.21; 313/231.41, 313/231.31; 118/723 E, 723 ER; 204/298.09; 219/121.52, 121.54, 121.57

(56) References Cited

U.S. PATENT DOCUMENTS

| 3,445,782 | 5/1969 | Sonkin ................................... 330/124 |
| 4,247,383 | 1/1981 | Greve et al. ........................... 204/298 |

(List continued on next page.)

FOREIGN PATENT DOCUMENTS

| 262246 | 11/1988 | (DE) . |
| 4113704 A1 | 4/1991 | (DE) . |
| 4437463C1 | 2/1996 | (DE) . |
| 4438463C1 | 2/1996 | (DE) . |
| 0186865 A2 | 7/1986 | (EP) . |
| 0528163 A1 | 2/1993 | (EP) . |
| 0553410 A1 | 8/1993 | (EP) . |
| 0564789 A1 | 10/1993 | (EP) . |
| 3-56671 | 3/1991 | (JP) . |
| 3-61368 | 3/1991 | (JP) . |
| WO 96/13964 | 5/1996 | (WO) . |

OTHER PUBLICATIONS

James A. Benjamin, "Use Hybrid Junctions For More VHF Power," Engineering Specialist ITT Semiconductors, West Palm Beach, Fla., Electronic Design 16, Aug. 1, 1968, pp. 54–59.

Joseph H. Johnson, "Solid–State Amplifier Delivers Reliable Meteor–Burst Communication", MSN & CT, Cover Feature, Sep., 1987, pp. 9–16.

Karl B. Niclas, "Planar Power Combining For Medium Power GaAs FET Amplifiers in X/Ku–Bands", Watkins–Johnson Company, Palo Alto, CA., Technical Feature/Microwave Journal (USA), vol. 22, No. 6, pp. 79–84, Jun., 1979.

International Search Report, PCT/US97/07815, International Filing Date: Jun. 5, 1997, Priority Date: Aug. 6, 1996, Applicant: Advanced Energy Industries, Inc. et al.

(List continued on next page.)

*Primary Examiner*—Justin P. Bettendorf
(74) *Attorney, Agent, or Firm*—Santangelo Law Offices, P.C.

(57) ABSTRACT

Current controlled power sources are disclosed that are capable of generating currents in low resistance, high temperature plasmas that are regulated to prevent the generation of excessive currents in the plasma. Current reversing switches are provided that control the flow of a direct current in a plasma chamber between various electrodes. Multiple power sources are provided in association with shunt switches for delivering a plurality of sources of direct current in various directions between electrodes in a plasma chamber. Inductive impedance can be provided in switch paths to cause a source of direct current to flow through a plasma chamber in various directions between electrodes.

9 Claims, 14 Drawing Sheets

U.S. PATENT DOCUMENTS

| | | | |
|---|---|---|---|
| 4,383,203 | 5/1983 | Stanley | 315/248 |
| 4,590,436 | 5/1986 | Butler et al. | 330/277 |
| 4,590,437 | 5/1986 | Butler et al. | 330/277 |
| 4,631,493 | 12/1986 | Vendelin et al. | 330/277 |
| 4,695,933 | 9/1987 | Nguyen et al. | 363/17 |
| 4,794,506 | 12/1988 | Hino et al. | 363/25 |
| 4,980,810 | 12/1990 | McClanahan et al. | 363/16 |
| 5,118,997 | 6/1992 | El-Hamamsy | 315/248 |
| 5,121,084 | 6/1992 | Anderson et al. | 330/295 |
| 5,178,739 | 1/1993 | Barnes et al. | 204/192.12 |
| 5,192,894 | 3/1993 | Teschner | 315/111.21 |
| 5,241,152 | 8/1993 | Anderson et al. | 219/121.57 |
| 5,286,360 | 2/1994 | Szczybrowski et al. | 204/298.08 |
| 5,300,205 | 4/1994 | Fritsche | 204/192.12 |
| 5,302,881 * | 4/1994 | O'Loughlin | 315/111.21 |
| 5,303,139 | 4/1994 | Mark | 363/63 |
| 5,306,986 | 4/1994 | Siao | 315/248 |
| 5,367,448 | 11/1994 | Carroll | 363/89 |
| 5,417,834 | 5/1995 | Latz | 204/298.11 |
| 5,460,707 | 10/1995 | Wellerdieck | 204/298.08 |
| 5,616,225 | 4/1997 | Sieck et al. | 204/298.14 |
| 5,718,813 | 2/1998 | Drummond et al. | 204/192.12 |

OTHER PUBLICATIONS

Winker, T., et al., "Dual Magnetron Sputtering for Glass Coating," International Conference on Metallurgical Coatings and Then Films, Apr. 22–26, 1996, San Diego, CA, 24 pages total.

MDX Astral™20 kW Bi–Polar Pulse Power Supply, Advanced Energy Brochure, 1996, Advanced Energy Industries, Inc., Fort Collins, CO, 6 pages total.

Sproul, W.D., et al., "Reactive Direct Current Magnetron Sputtering of Aluminum Oxide Coatings," Journal of Vacuum Science Technology 13(3) May/Jun. 1995, pp. 1188–1191.

Frach, P., et al., "Aspects and results of long–term stable deposition of Al 2O 3 with high rate pulsed reactive megnetron sputtering," Surface and Coating Technology vol. 59, 1993, pp. 177–182.

Schilling, G., et al., Pulsed Magnetron Sputter Technology, International Conference on Metallurgical Coatings and Thin Films, Apr. 19–23, 1993, San Diego, CA, pp. 1–24.

"Plasma Generators—RF & DC," Advertisement, ENI®, A Division of Astec America, Inc., 100 High Power Road, Rochester, N.Y., Nov. 14, 1995, one page total.

Williams, F.L., et al, "New method of arc suppression for reactive DC magnatron sputtering," (abstract for talk withdrawn before presentation 1992 Optical Society of America Annual Meeting, Sep. 20–25, 1992, Albuquerque, New Mexico, pp. 1–18.

Beisswenger, S., et al, "Econimical Consideration of Modern Web Sputtering Technology," Society of Vacuum Coaters, 35th Annual Technical Conference Proceedings (1992), pp. 128–134.

* cited by examiner

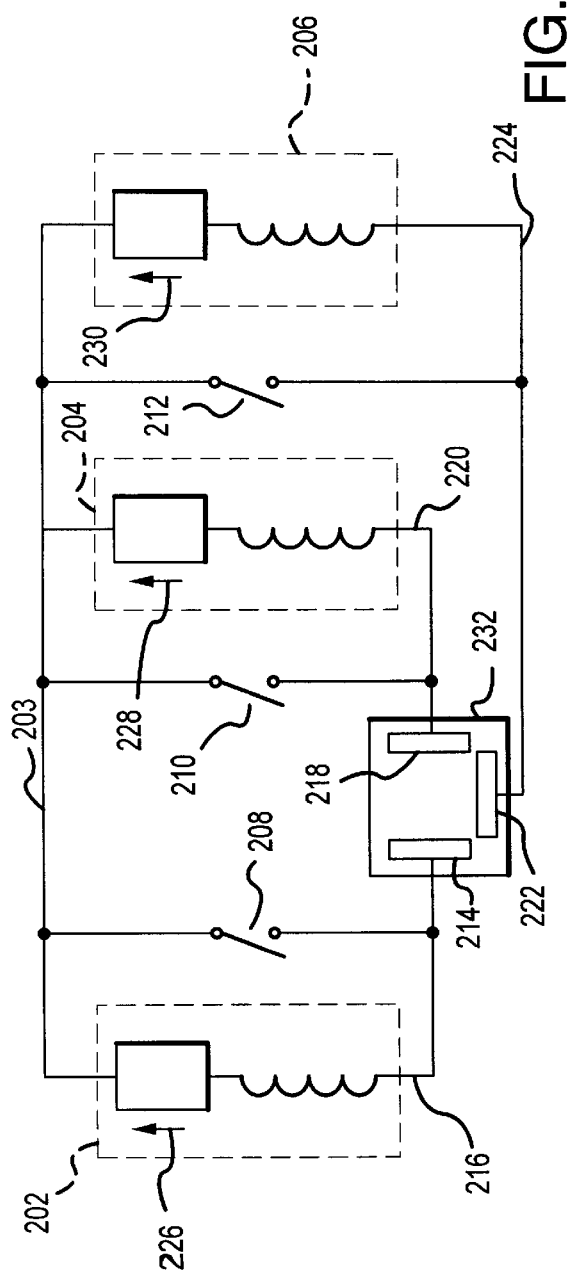
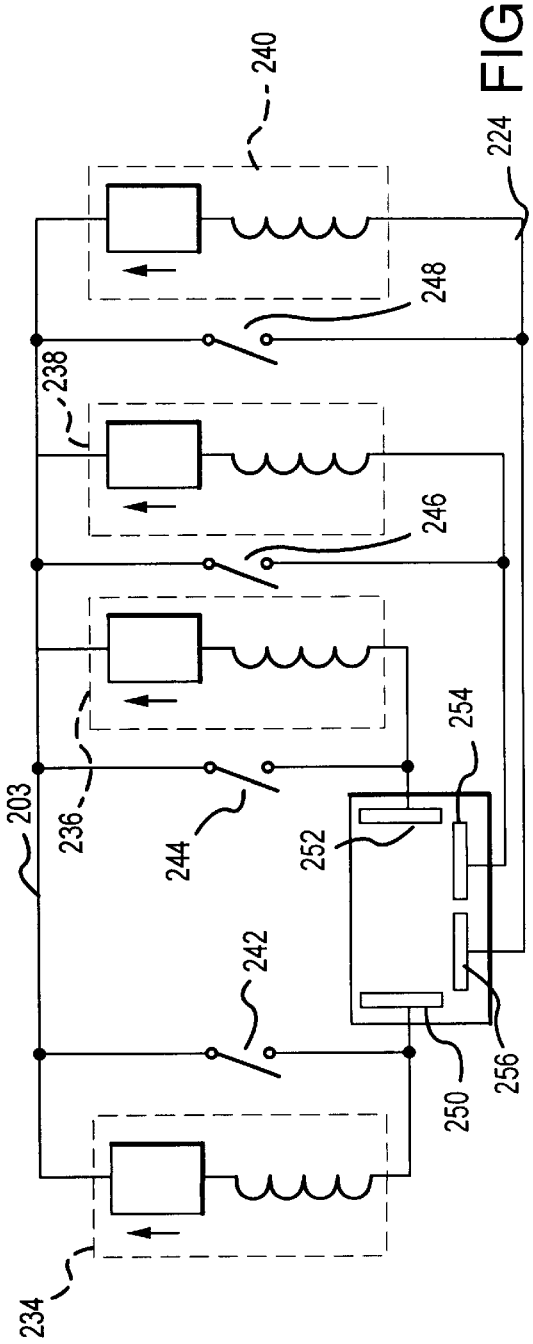

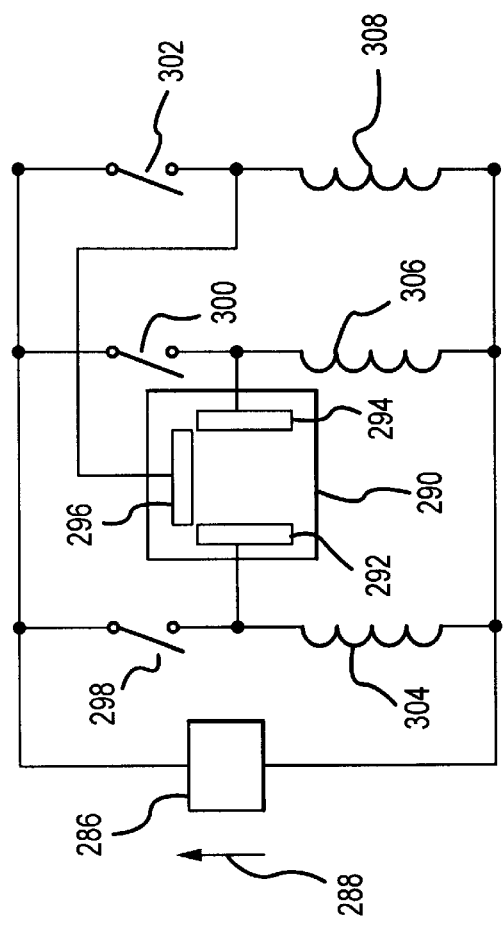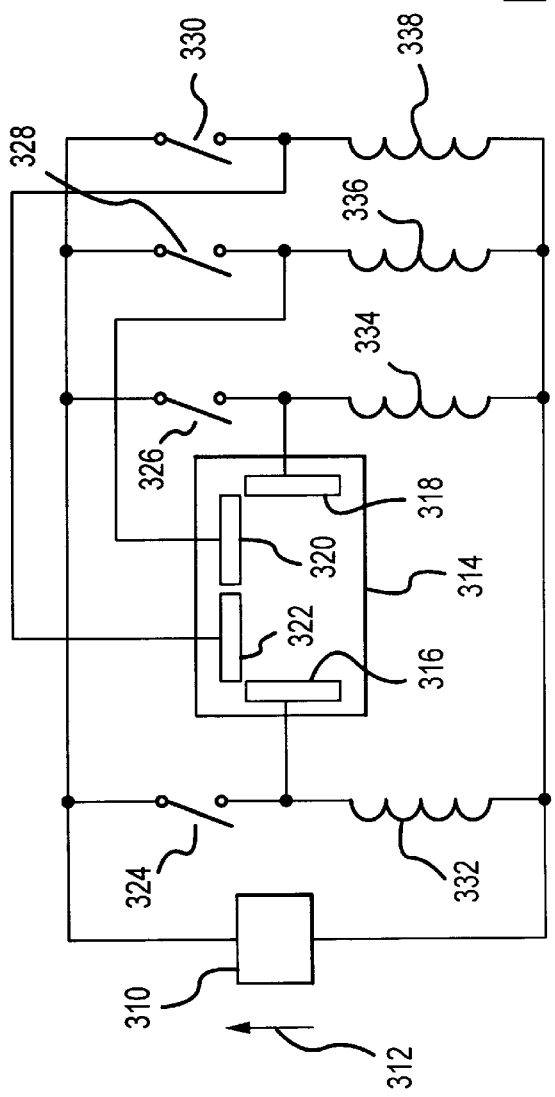

PLASMA GENERATOR PULSED DIRECT CURRENT SUPPLY IN A BRIDGE CONFIGURATION

This a continuation of application Ser. No. 08/646,616, filed May 8, 1996 now issued as U.S. Pat. No. 5,917,286 and hereby incorporated by reference.

BACKGROUND OF THE INVENTION

1. Field of Invention

The present invention pertains generally to power supplies and more particularly to pulsed DC power supplies that are used for generating plasmas that are used in thin film processing techniques for etching, deposition, etc.

2. Definitions

Alternating polarities means a current flow at any particular point in a circuit or plasma that changes direction, or a voltage at any particular point in a circuit that changes magnitudes around any desired neutral voltage.

Current connections means locations or points in a circuit that are coupled to electrodes of a plasma chamber.

Current controlled power source means a power source that is capable of maintaining a substantially constant current for a wide range of load impedances and has a low amount of capacitively stored energy.

Current reversing switches means any desired arrangement of switches that are capable of causing current to flow in different directions at a preselected location in a circuit.

Direct current means current that has a substantially constant magnitude.

Direction means the course of the flow of current on a conductor in a circuit.

Generating means initiating and/or maintaining.

Inductor means an electrical component that is designed to store energy in a magnetic field.

Plasma means a state of matter in which electrons and ions in a gas discharge are separated but together form a neutral assembly.

Plasma chamber means a device in which plasmas can be generated.

Power source means a device that is capable of supplying electrical energy.

Predetermined positions means either an opened or closed position of a switch.

Pulsed direct current means a current that flows at a particular point in a circuit that has a first substantially constant magnitude during a first period of time, and then has at least one additional substantially constant magnitude that is different from the first substantially constant magnitude during at least one additional subsequent period of time, and may repeat.

Substantially constant supply means a substantially constant magnitude.

DESCRIPTION OF THE BACKGROUND

Plasma processing techniques have found wide-spread use in industry for commercial processes such as plasma vapor deposition, sputtering, etc. These processes have become particularly useful in thin film applications. To generate a plasma, a power supply creates an electric potential between a cathode and one or more anodes that are placed in a plasma chamber containing the gases that are used to form the plasma. When using these processes for deposition, the plasma acts upon the material of a target placed in the plasma chamber that normally comprises the cathode surface. Plasma ions cause target material to be dislodged from the cathode surface. The target materials are then deposited on a substrate deposition surface to form a thin film. The thin film may constitute material sputtered by the plasma from the target surface, as disclosed above, or may be the result of a reaction between the target material and some other element included in the plasma. The materials and elements involved, as well as the specific applications of the plasma processing techniques vary greatly. Applications may range from coating architectural glass to deposition of thin film layers on microchips, or deposition of aluminum layers on compact disks.

In the past, high frequency voltage sources have been used to generate a high electrical potential that produces a plasma within a plasma chamber. These high-frequency voltage sources are expensive to construct and maintain, as well as dangerous to operate. Additionally, if the deposition material is formed by reaction with an element in the plasma, and further, is electronically insulating, the anode in the chamber can be coated with the insulator; this deposit can then prevent the anode from performing its function of collecting the electrons released from the plasma during the deposition process.

To overcome these disadvantages, pulsed DC voltage sources have been employed such as disclosed in U.S. Pat. No. 5,303,139 issued Apr. 12, 1994 to Mark, which is specifically incorporated herein by reference for all that it discloses and teaches. Mark discloses a constant voltage pulsed power supply that has alternating pulse polarities. The advantages of such a constant voltage pulsed power supply over the AC power supplies are that they are less expensive, easier to connect and set up, and overcome the problem of coating the anode if used with two target units. That is, the process of reversing polarities allows the electrodes to alternately act as anode and cathode; the sputtering process that occurs during the cathode phase cleans off any deposited insulating material and permits uninhabited operation of the electrode as an anode during the anode phase. Additionally, the process of reversing polarities allows both electrodes to alternatively act as a cathode so that both electrode surfaces are capable of providing target material.

Despite the advantages that constant voltage pulsed power sources provide, problems exist with regard to generation of excessive currents and spark discharges in the plasma chamber. As part of this problem, it has been found that as the current through a plasma increases, the resistance of the plasma decreases in an exponential manner to almost zero. Small changes in the voltage level of a voltage power source result in large changes in the current. Consequently, excessive current increases can be generated from only very small changes in the voltage level, and a high degree of accuracy is required for controlling voltage controlled power supplies to prevent excessive current increases.

To exacerbate the problem, it has been found that various benefits accrue including increases in efficiency as the plasma temperature is increased in the plasma chamber. It is therefore desirable to produce high temperature plasmas that have low resistances and that require the use of power supplies that operate in a controlled manner to prevent the generation of excessive currents. The high power required to produce the desired plasma temperatures places extreme demands on the power supply. For example, the power handling capabilities of switches and other electrical components must be increased to meet such high power specifications.

SUMMARY OF THE INVENTION

The present invention overcomes the disadvantages the limitations of the prior art by providing a current controlled power supply that produces direct current pulses having alternating polarities to generate high temperature plasmas. A single power source, multiple power sources and/or multiple electrodes can be employed in accordance with the present invention.

The present invention therefore may comprise an apparatus for generating a pulsed direct current having alternating polarities to be applied to a plasma chamber to generate plasmas comprising, a power source that generates a substantially constant supply of direct current, current connections for delivering the pulsed-direct current to the plasma chamber, and current reversing switches having at least two pre-determined positions, the current reversing switches coupled to the power source and the current connections that cause the substantially constant supply of the direct current to flow in a first direction through the current connections whenever the current reversing switches are set in a first pre-determined position, and in a second direction through the current connections whenever the current reversing switches are set in a second pre-determined position.

The present invention may also comprise a method of generating a source of pulsed current having alternating polarities for use in generating a plasma comprising the steps of, generating a substantially constant supply of current from a current controlled power source, and switching current flow direction of the substantially constant supply of current to be supplied to said plasma using flow reversing switches that produce the source of pulsed current having alternating polarities for generating said plasma.

The present invention may also comprise a method for causing two substantially constant direct currents to flow in a plasma chamber comprising the steps of, generating a first substantially constant direct current using a first current controlled power source, generating a second substantially constant direct current using a second current controlled power source, connecting the first current controlled power source to the plasma chamber to cause the first substantially constant direct current to flow through the plasma chamber in a first direction during a first pre-determined period, and connecting the second current controlled power source to the plasma chamber to cause the second substantially constant direct current to flow through the plasma chamber in a second direction during a second pre-determined period.

The present invention may also comprise a circuit for generating a direct current that flows between a plurality of electrodes in a plasma chamber comprising, a current controlled power source that generates a substantially constant supply of the direct current, a switch connected between the current controlled power source and each electrode of the plurality of electrodes, and inductors coupled between the electrodes of the plasma chamber and a common return of the current controlled power source that cause the direct current to flow in the plasma chamber when at least one of the switches is open and at least one other is closed.

A first advantage of the present invention is that the current controlled power source provides a device for accurately controlling the amount of current that is applied to the plasma chamber despite changes in the resistance of the plasma. The switches that control the flow of current through the plasma chamber can also be utilized to shunt current. Multiple electrodes can be used in conjunction with either a single power source or multiple power sources to increase the deposition capabilities of the plasma chamber. Multiple electrodes allow for multiple target surfaces when each of the electrodes is sequentially employed as the cathode target surface.

BRIEF DESCRIPTION OF THE DRAWINGS

FIG. 23 is a schematic circuit diagram of an embodiment of the present invention utilizing three current controlled power sources coupled to three electrodes.

FIG. 24 is a schematic circuit diagram of another embodiment of the present invention utilizing four current control power sources coupled to four electrodes.

FIG. 26 is a schematic circuit diagram of another embodiment of the present invention that utilizes a single power source with three switches and three electrodes.

FIG. 27 is a schematic circuit diagram of another embodiment of the present invention that utilizes a single power source, four switches and four electrodes.

DETAILED DESCRIPTION OF THE PREFERRED EMBODIMENT OF THE INVENTION

Figure 1:
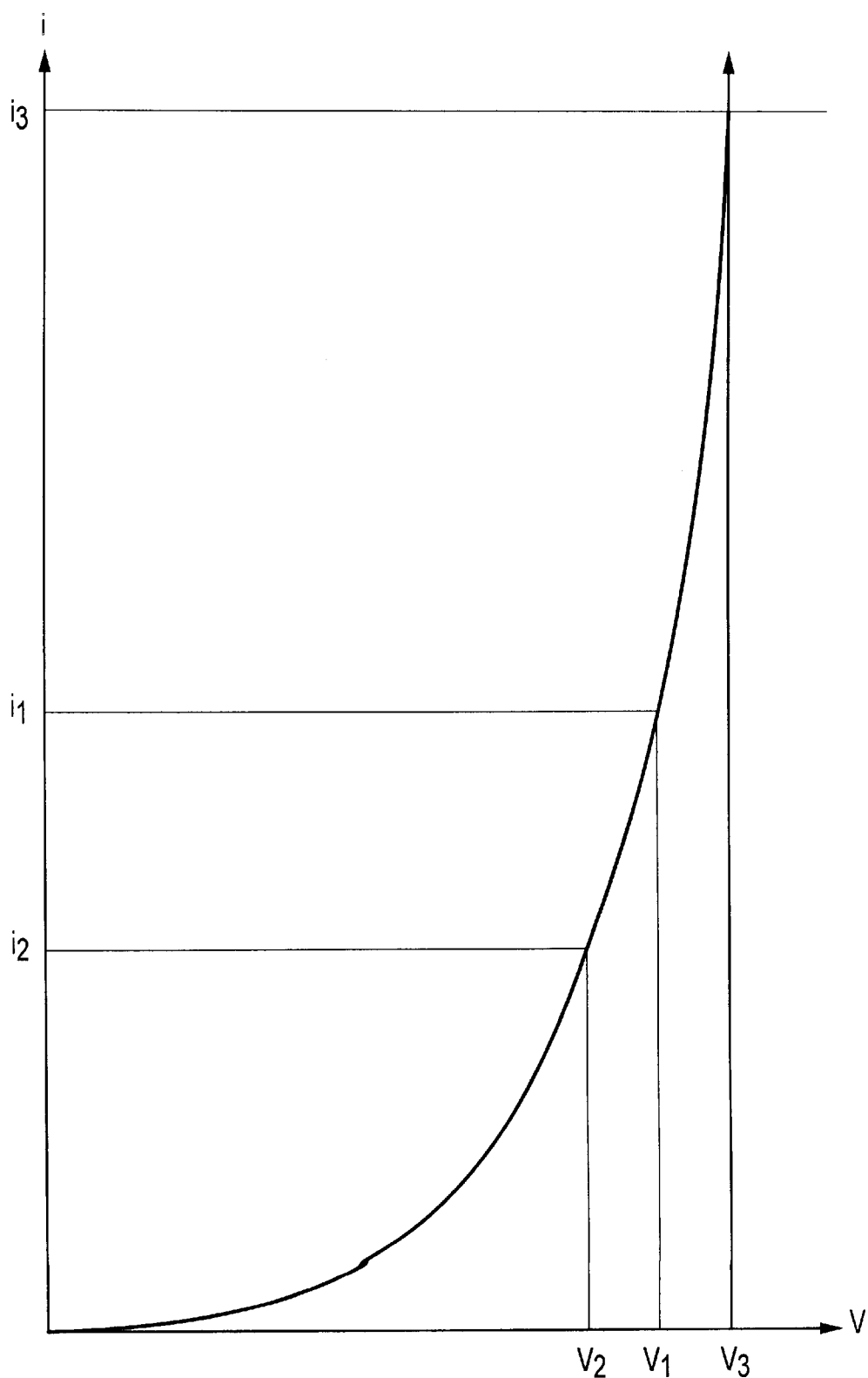
FIG. 1 is a graph of current versus voltage illustrating the current/voltage characteristics of a plasma.

FIG. 1 illustrates the advantages of driving the plasma generator with a current source through current reversing switches. FIG. 1 shows the current/voltage characteristics of a typical plasma chamber. As shown in FIG. 1, as the voltage increases, the current through the plasma chamber rises exponentially. As is readily apparent from FIG. 1, once the slope of the current versus voltage curve of FIG. 1 exceeds 45 degrees, it is better to control the power source with current rather than with voltage. Accordingly, at the operating point of a current $i_1$, a small change in voltage can produce a large change in current around $i_1$. For example, although a small change in voltage from $v_1$ to $v_2$ only produces a relatively small change in current from $i_1$ to $i_2$ an equally small change in voltage from $v_1$ to $v_3$ causes a very large change in current from $i_1$ to $i_3$. Thus, a voltage source driving the plasma chamber is very susceptible to arc discharges as a result of minor variations or instability in the voltage.

Figure 2:
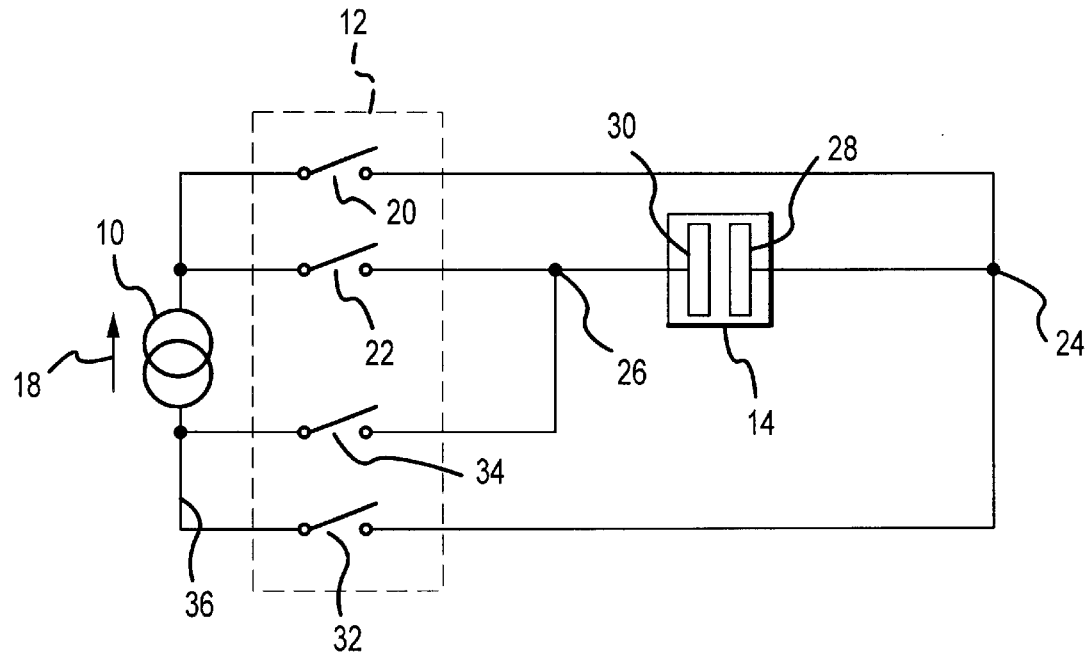
FIG. 2 is a schematic circuit diagram of a current source employed in accordance wit hone embodiment of the present invention.

However, if the plasma generating chamber is driven by a current source 10 and the switch configuration 12 illustrated in FIG. 2, the current $i_1$ may be easily controlled even though the voltage $v_1$ may vary substantially about the operating point, because the current source 10 is capable of rapid voltage changes that may be required by rapid changes in the resistance of plasma chamber 14.

FIG. 2 illustrates a preferred embodiment of the invention which includes a current source 10 driving a plasma chamber, as referred to above. In operation, current source 10 drives a current 18 that is applied to switches 20 and 22 that are connected in a parallel configuration. Switches 20 and 22 can be alternately and substantially simultaneously closed to apply current to current connections or nodes 24 and 26 as illustrated in FIG. 2. The current connections or nodes 24 and 26 are coupled to electrodes 28 and 30 of plasma chamber 14. Node 24 is connected to a switch 32, which is in turn connected to the common return 36 of current source 10. Similarly, node 26 is connected to switch 34, which is in turn connected to the common return 36 of current source 10.

Referring again to FIG. 2, the switch configuration 12 can be used as current reversing switches that operate in the following manner. In a first state of operation, switches 20 and 34 are closed and switches 22 and 32 are open. In this manner, current is caused to flow from electrode 28 to electrode 30 in plasma chamber 14. Hence, the direction of flow of the current in the plasma chamber 14 is from electrode 28 to electrode 30.

Figure 4:
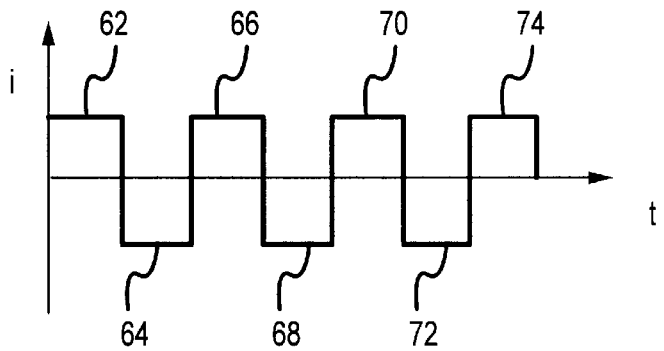
FIG. 4 is a graph of the current pulses that can be produced in the plasma by the embodiment of FIG. 3.

In a second state of operation, switches 20 and 34 are open and switches 22 and 32 are closed. This causes the current 18 from current source 10 to flow in the plasma chamber 14 from electrode 30 to electrode 28. Hence, the direction of flow of current in the second state of operation in the plasma chamber 14 is from electrode 30 to electrode 28. By operating the switch configuration 12 in this manner, pulses of direct current having alternating polarities can be generated in the plasma chamber 14, as illustrated in FIG. 4.

Figure 5:
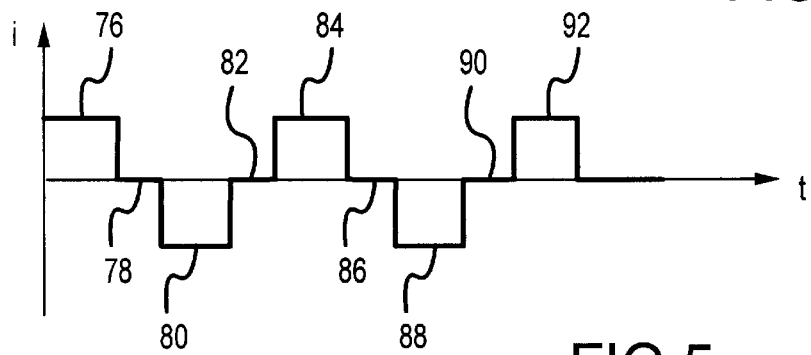
FIG. 5 is a schematic illustration of an alternative arrangement of current pulses that can be produced in the plasma that provide a predetermined duty cycle.

In a third state of operation, all four of the switches 20, 22, 34, 32 of switch configuration 12 can be closed so that no current flows through plasma chamber 14. It may be desirable to place the switch configuration 12 in this state when an arc discharge or a potential arc discharge is detected in plasma chamber 14. Additionally, this state of operation wherein all the switches are closed during a preselected time period may be desirable to modify the duty cycle of the substantially constant supply of direct current 18 being applied to plasma chamber 14, such as illustrated in FIG. 5.

Figure 3:
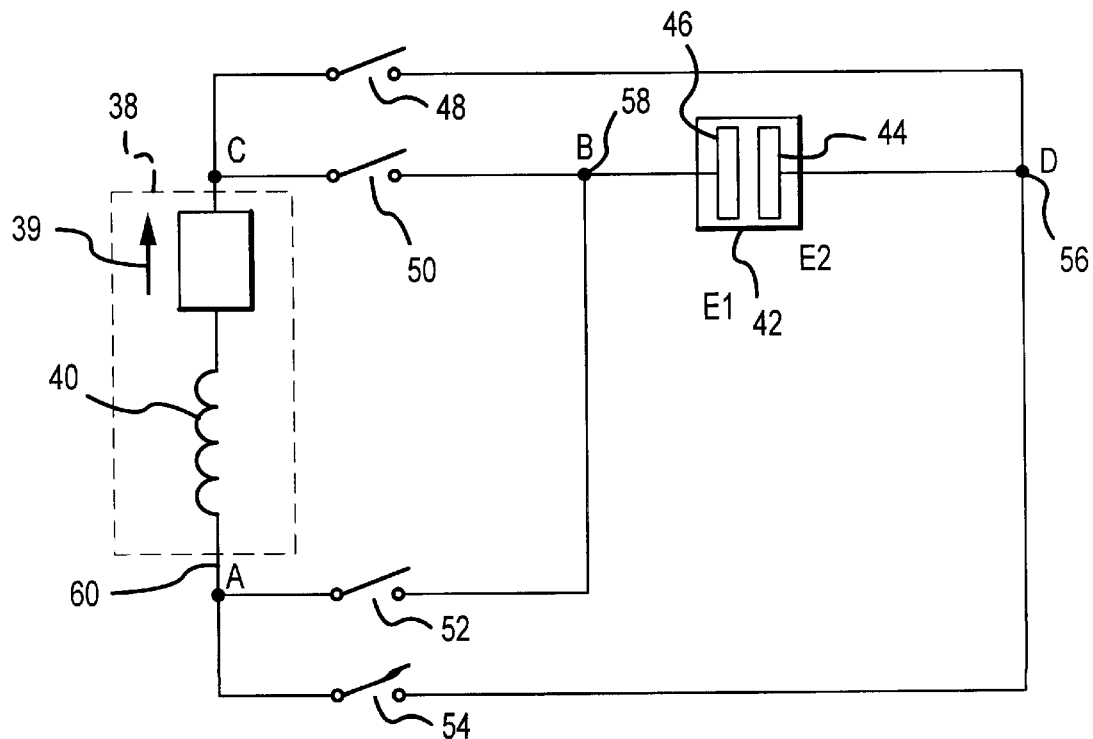
FIG. 3 is a schematic circuit diagram of a first embodiment of the present invention that uses a single power source.

FIG. 3 is a schematic circuit diagram of the manner in which the present invention is implemented with a power source 38. As shown in FIG. 3, power source 38 also includes an inductor 40 which helps the power source 38 to function in a manner similar to an ideal current source, such as ideal current source 10 shown in FIG. 2. Power source 38, in conjunction with inductor 40, is constructed in a manner to approximate the operation of an ideal current source within the practical limits of operation using available components. For example, a sudden decrease in the resistance in the plasma chamber 42 that results in an arc discharge between electrodes 44 and 46 will cause an instantaneous shift in impedance to inductor 40. Power source 38 is designed to provide the desired impedance over longer durations.

In operation, the circuit of FIG. 3 operates in the same manner as described with regard to FIG. 2. When switches 48 and 52 are closed simultaneously, current 39 flows through the plasma chamber 42 from electrode 44 to electrode 46. In this case, the current 39 is applied to current connection, or node 56 via switch 48, while electrode 46 is coupled to the common return 60 of power source 38 via current connection 58 and switch 52. In a similar manner, switches 50 and 54 can be closed simultaneously to cause current to be applied to current connection or node 58, and the common return 60 to be coupled to current connection, or node 56, via switch 54. In this case, direct current 39 flows from electrode 46 to electrode 44 in plasma chamber 42. Hence, by alternately closing switches 48, 52 and 50, 54, the current flow through the plasma chamber 42 produces direct current pulses having alternating polarities in the plasma chamber 42, such as illustrated in FIG. 4. Since the current 39 is produced by a power source 38 that generates a substantially constant supply of direct current, these pulses comprise pulsed direct current having alternating polarities in the plasma chamber 42.

The device of FIG. 3 can also be operated in a third state of operation such as described with respect to FIG. 2. In the same manner as described above, all four switches, 48, 50, 52, 54 can be closed so that direct current 39 is shunted around the plasma chamber 42. The direct current 39 does not pass through the plasma chamber 42. The switches 48, 50, 52, 54 comprise current reversing switches that are therefore capable of reversing the flow direction of current in the plasma chamber 42, and also shunting the current 39 so that no current flow through plasma chamber 42. Hence, in the third state of operation of switches 48, 50, 52, 54, pulses such as those illustrated in FIG. 5 can be generated so that a predetermined duty cycle of the operation of plasma chamber 42 can be produced. Also, in the same manner as described above with regard to FIG. 2, the third state of operation can be initiated when an arc discharge is detected, or the potential for an arc discharge is detected, to minimize damage caused in the plasma chamber 42.

The power source 38 of FIG. 3 is also designed so that only a small amount of capacitive storage is provided across its outputs. This allows power source 38 to function as nearly as possible as an ideal current supply.

FIG. 4 illustrates a source of pulsed direct current having alternating polarities that is applied to a plasma chamber to generate plasmas. As described above, switches 48 and 52 are closed while switches 50 and 54 are substantially simultaneously opened during a first state of operation that produces a pulse of direct current 62 for a predetermined period in the plasma. At the end of such a predetermined period, a second state of operation is produced when switches 48 and 52 are opened while switches 50 and 54 are substantially simultaneously closed. During this second state of operation, a pulse of direct current 64 is produced for a second predetermined period. This process can be repeated to produce a series of direct current pulses having alternating polarities such as illustrated by pulses 66, 68, 70, 72, 74, and so on. FIG. 4 therefore illustrates the manner in which the switches 48, 50, 52 and 54 can be operated alternatively between a first and second state to produce a series of direct current pulses having alternating polarities in a plasma chamber.

FIG. 5 illustrates the manner in which switches 48, 50, 52 and 54 of FIG. 3 can be alternatively operated in three different states. As shown in FIG. 5, switches 48, 50, 52 and 54 can be operated in a first state to produce a direct current pulse 76. The switches can then be operated in a third state by closing all of the switches 48, 50, 52, 54 to produce output 78 during a second predetermined period. In the third state of operation, no current flows through the plasma chamber 42 as shown at output 78 of FIG. 5. During a third predetermined period, the switches can be operated in a second state to produce a current pulse 80 in the plasma chamber 42. During a fourth predetermined period, the switches can again be operated in a third state to produce output 82 during which no current flows through the plasma chamber 42. This process can be repeated to produce outputs 84, 86, 88, 90, 92, and so on. The series of alternating polarity current pulses illustrated in FIG. 5 provide a predetermined operating duty cycle of the plasma chamber 42 that is dependent upon the length of the operation of the switches in the third state.

Figure 6:
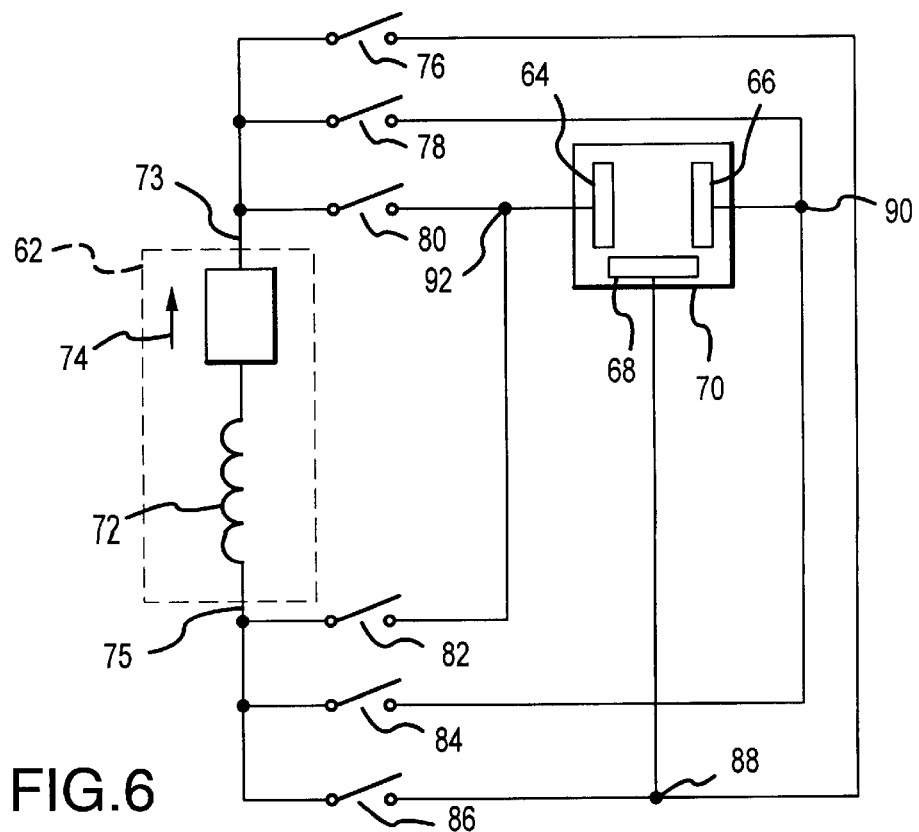
FIG. 6 is a schematic illustration of another embodiment of the present invention that uses a single current controlled power source with three electrodes.

FIG. 6 illustrates another embodiment of the present invention which utilizes a single power source 62. Power source 62 generates a substantially constant supply of direct current 74 that is applied to three electrodes 64, 66, 68 in a plasma chamber 70. As shown in FIG. 6, power source 62 includes an inductor 72 that allows power source 62 to approximate the operation of a current source that is capable of providing a substantially constant supply of direct current 74. As shown in FIG. 6, power source 62 has a current output 73 that is coupled to parallel switches 76, 78 and 80. Similarly, switches 82, 84, 86 are connected in parallel to common return 75 of power source 62. Switch 76 is coupled to connection or node 88, which is in turn connected to electrode 68. Switch 78 is connected to connection or node 90, which is in turn connected to electrode 66. Switch 80 is connected to connection or node 92, which is in turn connected to electrode 64.

The device of FIG. 6 has six different states of operation that are illustrated in FIGS. 7 through 18. FIGS. 7–9 and 13–15 all illustrate voltage waveforms for electrodes 64, 66 and 68. These voltage waveforms illustrate the difference in voltage between these various electrodes and the plasma chamber, and also earth ground since the plasma chamber is usually connected to earth ground. The power sources, however, may float with respect to earthground and the plasma chamber.

Figure 7:
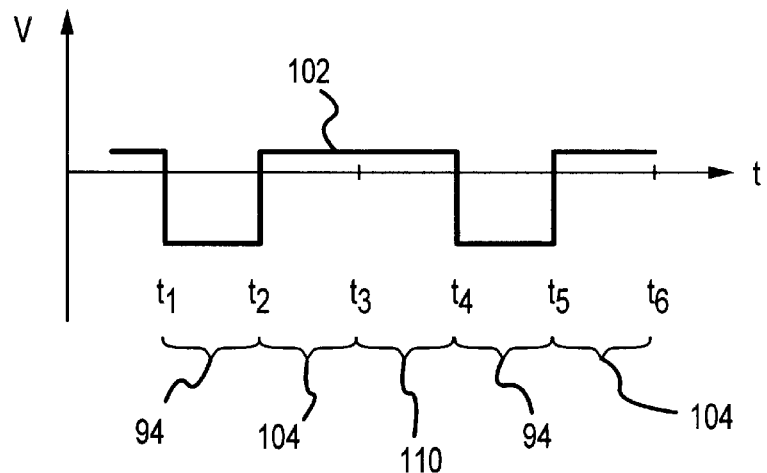
FIG. 7 is a graph of the voltage on electrode 64 when various switches are closed.

FIG. 7 illustrates the voltage on electrode 64 during three states of operation. During the first state of operation 94 the voltage 102 on electrode 64 is negative. The first state of operation 94 occurs during the time period from times t1 to t2. Referring to FIG. 6, switches 82, 78 and 76 are closed and switches 80, 84, 86 are open during the first state of operation 94. As can be seen from FIG. 6, the direct current 74 is applied to node or connections 88 and 90, that causes current to flow from electrodes 66 and 68 to electrode 64.

Figure 10:
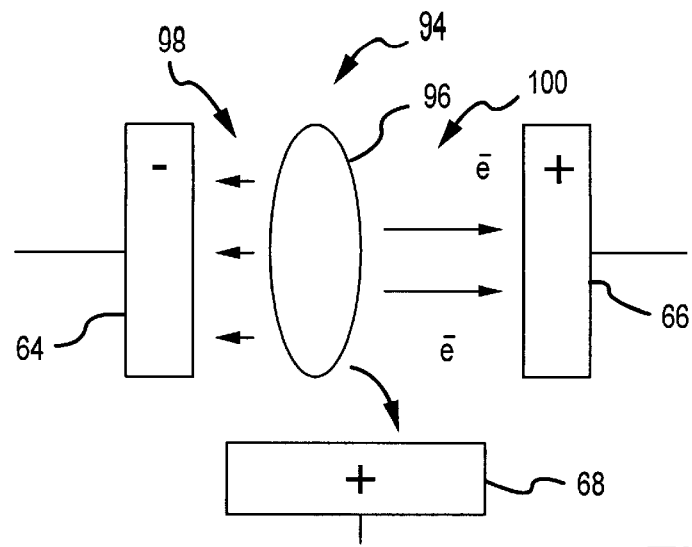
FIGS. 10–12 schematically illustrate various conditions in a plasma chamber for a first, second and third states of operation.

FIG. 10 illustrates the condition of the plasma chamber 70 during the first state of operation 94. As shown in FIG. 10, electrode 64 comprises a cathode while electrodes 66 and 68 comprise anodes. A plasma 96 is generated proximate to cathode 64, as illustrated in FIG. 10. Ions 98 are attracted to cathode 64, while electrons 100 from plasma 96 are attracted to anode 66 and anode 68.

FIG. 7 also illustrates the voltage 102 on electrode 64 during a second state of operation 104 that occurs from times t2 to t3. As shown in FIG. 7, the voltage 102 on electrodes 64 is slightly positive during the second state of operation 104.

Referring to FIG. 6, the second state of operation occurs when switches 78, 80 and 86 are closed, and switches 76, 82, 84 are open. When switches 78 and 80 are closed, current is applied to electrodes 64 and 64 through nodes or connections 90 and 92, respectively. When switch 86 is closed, electrode 68 is coupled to the common return 75 of the power source 62.

Figure 11:
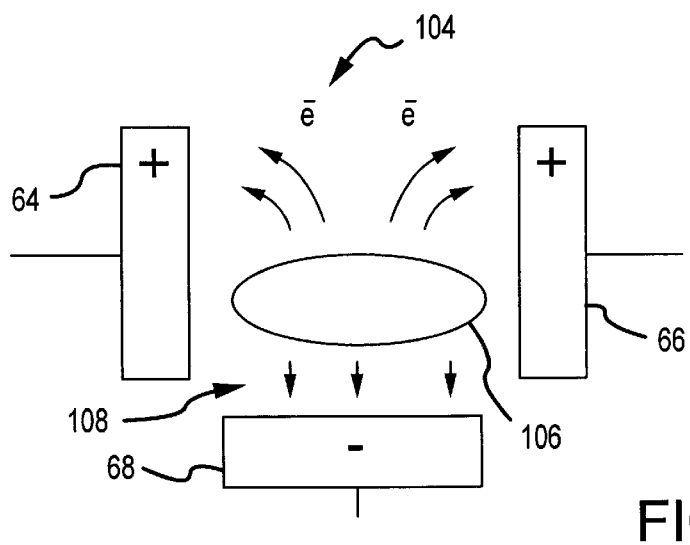

FIG. 11 illustrates the condition of operation of the plasma chamber during the second state of operation 104. As shown in FIG. 11, electrode 68 functions as a cathode, while electrode 64 and 66 function as anodes. A plasma 106 is generated proximate to the cathode 68. Positive ions 108 are attracted to the cathode 68, while negative electrons are attached to anodes 64 and 66.

FIG. 7 additionally illustrates the voltage 102 on electrode 64 during a third state of operation 110 that occurs from time t3 to t4. As shown in FIG. 7, the voltage 102 on electrode 64 during the third state 110 is slightly positive.

Referring to FIG. 6, the third state of operation occurs when switches 76, 80 and 84 are closed and switches 78, 82 and 86 are open. When switches 76 and 80 are closed, direct current 74 is applied to electrodes 68 and 64 via nodes 88 and 92, respectively. By closing switch 84, electrode 66 is connected to the common return 75 of power source 62.

Figure 12:
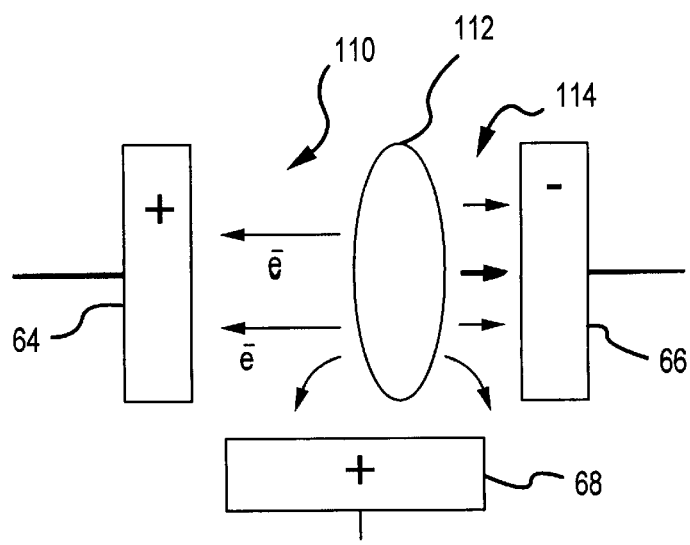

FIG. 12 illustrates the condition of the plasma chamber 70 during the third state of operation 110. Electrode 66 functions as a cathode, while electrodes 64 and 68 function as anodes. A plasma 112 is generated proximate to cathode 66. Plasma 112 generates ions 114 that are attracted to cathode 66 and electrons that are attracted to anodes 64 and 68.

Figure 8:
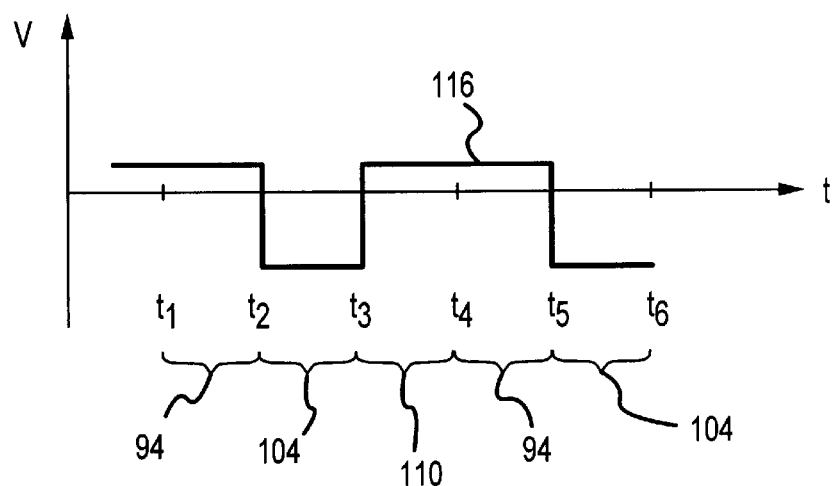
FIG. 8 is a graph of the voltage on electrode 68 when various switches are closed.

Referring again to FIG. 7, the first state of operation is again repeated between times t4 and t5, so that a negative voltage pulse is produced on electrode 64. Similarly, the second state of operation 104 is repeated from times t5 and t6. These three states of operation can be repeated in the order shown, or any desired order of operation of the switches 76 through 86. FIG. 8 illustrates the voltages 116 produced on electrode 68 during the three states of operation. As shown in FIG. 8, the voltage 116 on electrode 68 is positive during the first state of operation 94, is negative during the second state of operation 104, and is positive again during the third state of operation 110. The voltages 116 on electrode 68 are illustrated in FIGS. 10–12.

Figure 9:
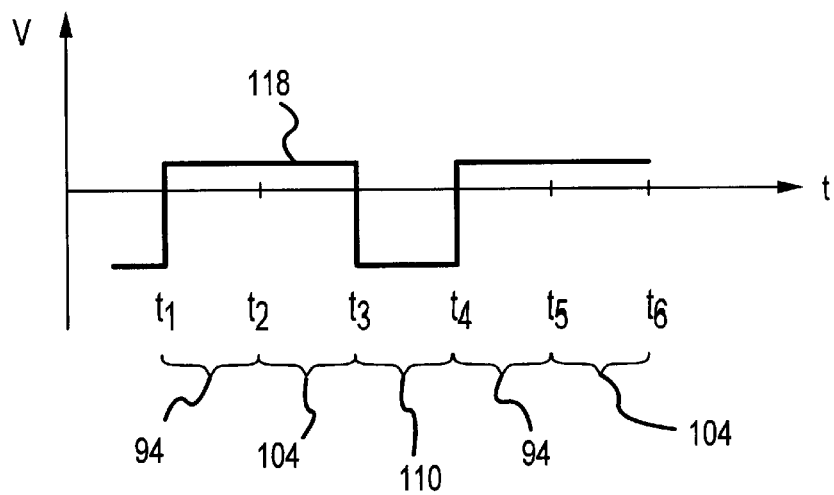
FIG. 9 is a graph of the voltage on electrode 66 when various switches are closed.

FIG. 9 illustrates the voltages 118 produced on electrode 66 during the three states of operation. As shown in FIG. 9, the voltage 118 on electrode 66 is positive during the first state of operation 94 and the second state of operation 104. The voltage 118 on electrode 66 is negative during the third state of operation 110. It is possible and reasonable to operate the system of FIG. 6 in only these three first states of operation or to operate additionally with states wherein more than one element at a time acts as a cathode.

Figure 13:
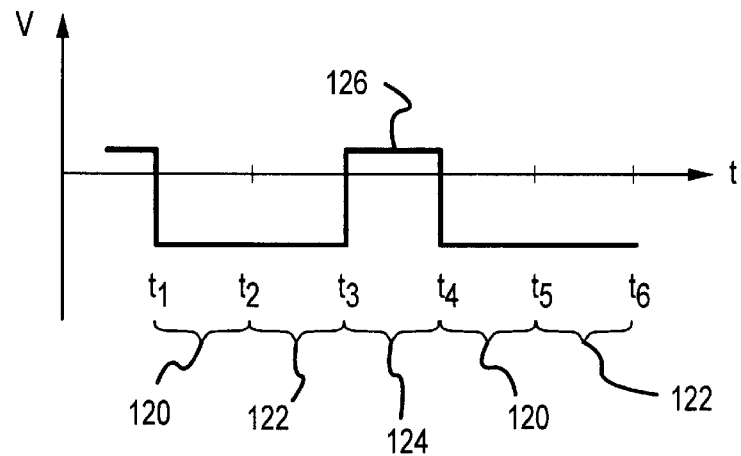
FIG. 13 is a graph of the voltage on electrode 64 for the fourth, fifth and sixth states of operation.
Figure 14:
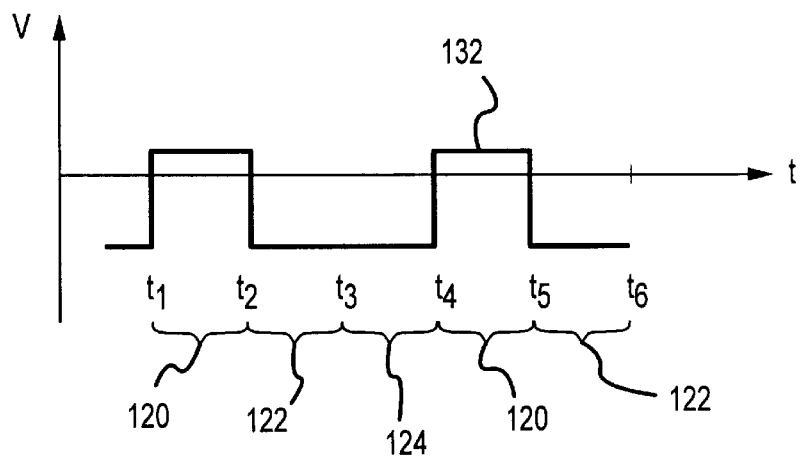
FIG. 14 is a graph of the voltage on electrode 68 for the fourth, fifth and sixth states of operation.
Figure 15:
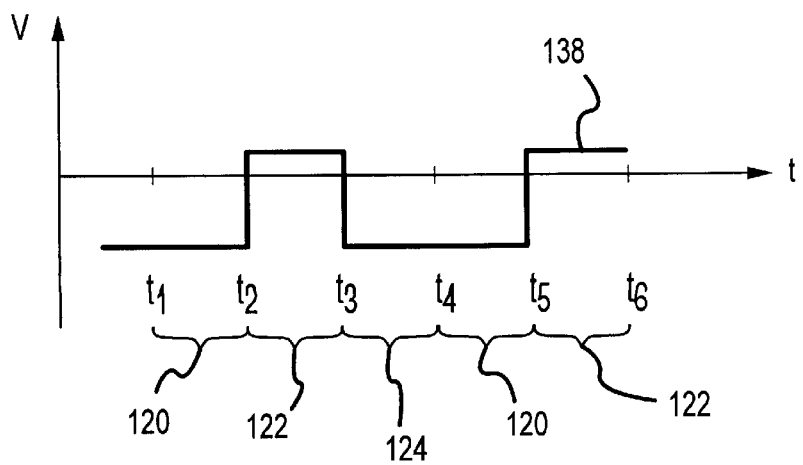
FIG. 15 is a graph of the voltages on electrode 66 for the fourth, fifth and sixth states of operation.

FIGS. 13–15 illustrate the voltages on the electrodes 64, 68 and 66 during the fourth state 120, fifth state 122 and sixth state 124.

FIG. 13 illustrates the voltage 126 on electrode 64 during the fourth state 120, fifth state 122 and sixth state 124. As shown in FIG. 13, the voltage 126 on electrode 64 is negative during the fourth state 120 and fifth state 122. The voltage 126 on electrode 64 is positive during the sixth state 124. As also illustrated in FIG. 13, the various states 120, 122, 124 can be repeated in order or, can be repeated in any desired order to produce the desired conditions on the electrodes 64, 66 and 68.

Referring to FIG. 6, the fourth state of operation 120 occurs when switches 76, 82 and 84 are closed, and switches 78, 80 and 86 are open. When switch 76 is closed, current is applied to electrode 68 via connection or node 88. By closing switches 82 and 84, electrodes 64 and 66 are connected to common return 75 of power source 62 through connection or nodes 92 and 90, respectively.

Figure 16:
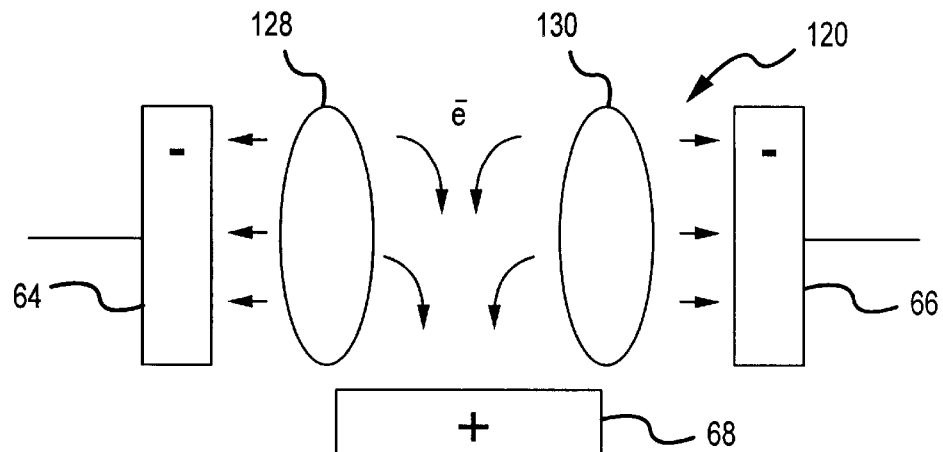
FIGS. 16–18 schematically illustrate various conditions of the plasma in the plasma chamber during the fourth, fifth and sixth states of operation.

FIG. 16 illustrates the condition of the plasma chamber 70 during the fourth state of operation 120. Electrode 68 comprises an anode, while electrodes 64 and 66 comprise cathodes. Plasma 128 is generated proximate to cathode 64. Ions from plasma 128 are attached towards cathode 64, while electrons from plasma 128 are attracted towards anode 68. A plasma 130 is generated proximate to cathode 66. Ions from plasma 130 are attracted to cathode 66, while electrons from plasma 130 are attracted to anode 68.

FIG. 14 illustrates the voltage 132 on electrode 68 during the fourth state 120, fifth state 122 and sixth state 124. As shown in FIG. 14, the voltage 132 on electrode 68 is slightly positive during the fourth state 120, and negative during the fifth state 122 and sixth state 124.

Figure 17:
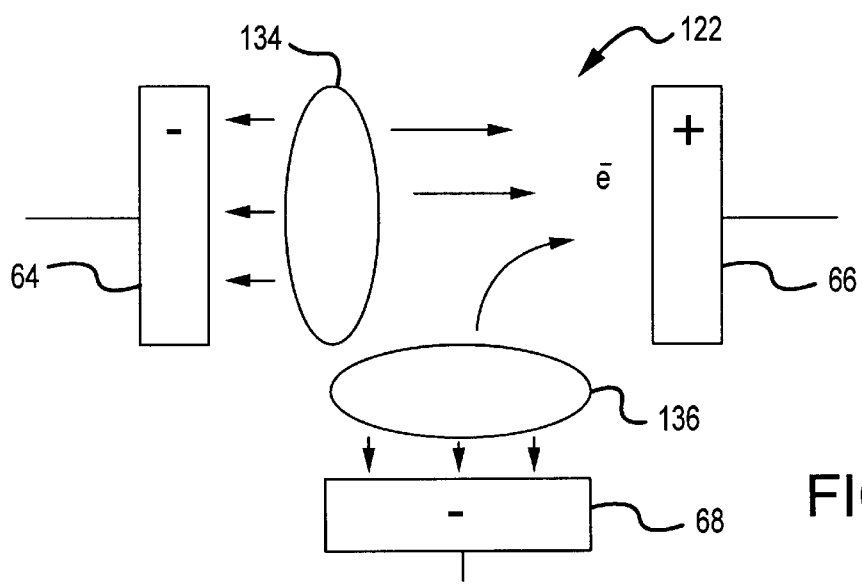

FIG. 17 illustrates the condition of the plasma chamber 70 during the fifth state 122. As shown, electrodes 64 and 68 comprise cathodes, while electrode 66 comprises an anode. A plasma 134 is generated proximate to cathode 64. Ions from plasma 134 are attracted to cathode 64, while electrons from plasma 134 are attracted to anode 66. Similarly, a plasma 136 is generated proximate to cathode 68. Ions from plasma 136 are attracted to cathode 68, while electrons from plasma 136 are attracted to anode 66.

FIG. 15 illustrates the voltage 138 on electrode 66 during the fourth state 120, fifth state 122 and sixth state 124. During the fourth state 120, the voltage 138 on electrode 66 is negative. During the fifth state 122, the voltage 138 on electrode 66 is slightly positive. During the sixth state 124, the voltage 138 on electrode 66 is negative.

Referring to FIG. 6, switches 80, 84 and 86 are closed and switches 76, 78 and 82 are open during the sixth state. As shown in FIG. 6, the direct current 74 is applied to electrode 64 via connection or node 92. When switches 84 and 86 are closed, electrodes 66 and 68 are coupled to the common return 75 of power source 62 via nodes or connections 90 and 88, respectively.

Figure 18:
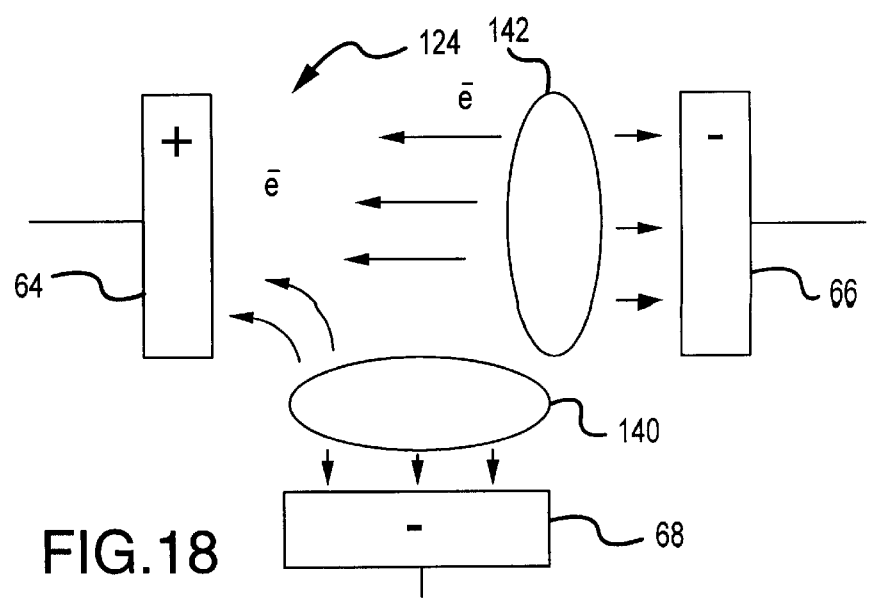

The condition of the plasma chamber 70 during the sixth state 124 is illustrated in FIG. 18. As shown in FIG. 18, electrode 64 comprises an anode, while electrodes 66 and 68 comprise cathodes. A plasma 140 is generated proximate to cathode 68. Positive ions from plasma 140 are attracted to cathode 68, while negative electrons are attracted to anode 64. Similarly, a plasma 142 is generated proximate to cathode 66. Ions from plasma 142 are attracted to cathode 66, while negative electrons are attracted to anode 64. Although not shown, all of the switches of FIG. 6 can be closed during the same time to generate a seventh state of operation in which no current flows through the plasma chamber 70. It is possible to operate the system of FIG. 6 in any combinations of these states depending upon desired results. This seventh state of operation, as described above, may be utilized for arc discharge dissipation or to provide a duty cycle within the plasma chamber 70.

Figure 19:
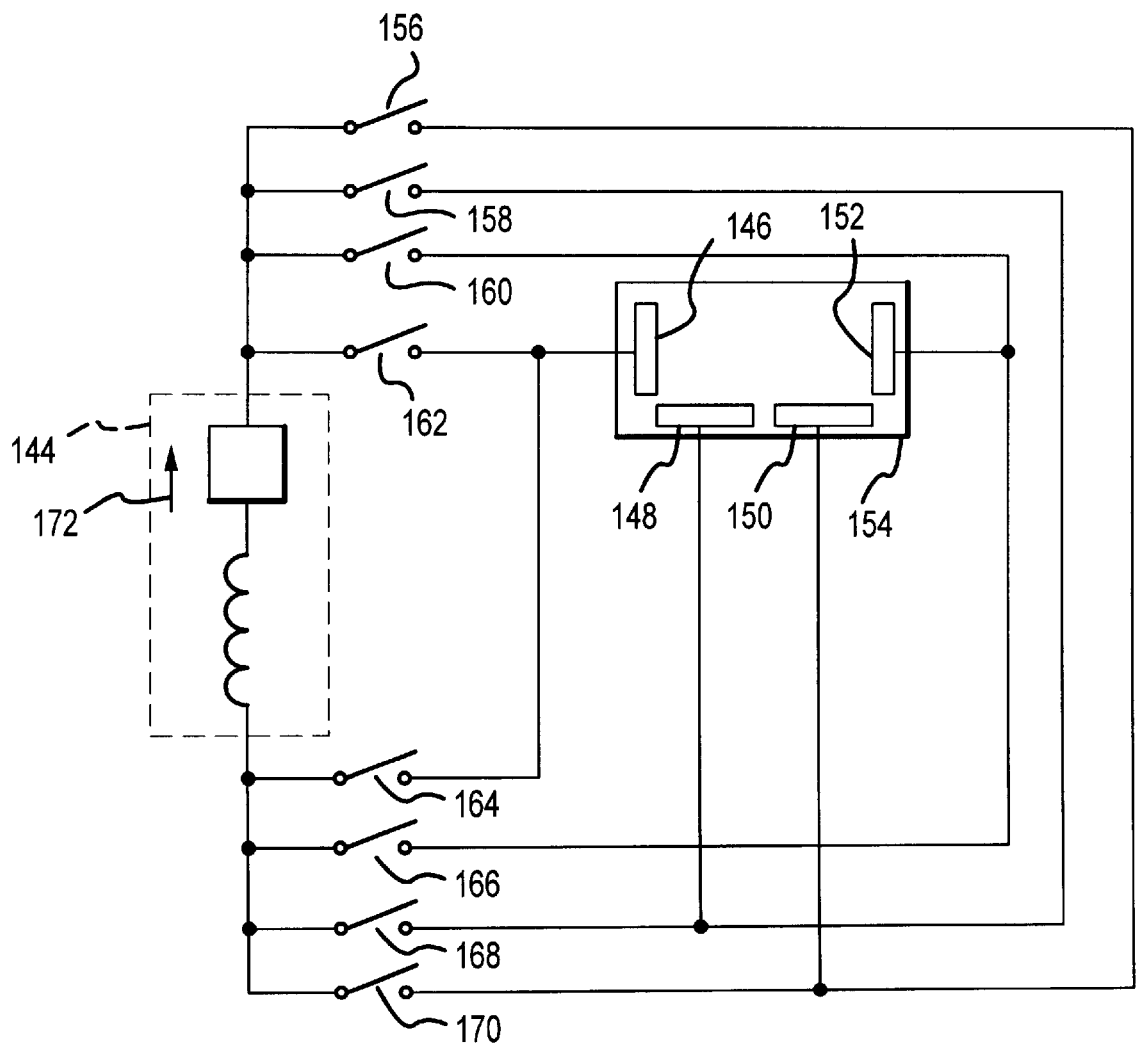
FIG. 19 is a schematic illustration of an embodiment of the present invention utilizing a single power source and four electrodes.

FIG. 19 is a schematic circuit diagram of another embodiment of the present invention. The embodiment of FIG. 19 illustrates the use of a single current controlled power source 144 that is capable of generating a substantially constant supply of direct current 172 in combination with four electrodes 146, 148, 150 and 152 disposed in a plasma chamber 154. FIGS. 6 and 19 illustrate the manner in which any desired number of electrodes can be placed in a single plasma chamber utilizing a singlecurrent control power source. Switches 156, 158, 160, 162, 164, 166, 168 and 170 can be opened and closed in any desired configuration to generate various states within the plasma chamber 154 as desired.

The advantages of using multiple electrodes in a plasma chamber are that the target surfaces which comprise the cathode can be changed from one electrode to another to provide additional cathode surfaces. Moreover, additional anode surfaces are provided in the plasma chamber 154 to attract negative electrons that enhances the generation of the plasma. Of course, any desired configuration of the electrodes can be used within the plasma chamber 154 other than that shown in FIG. 19, or any of the figures.

Figure 20:
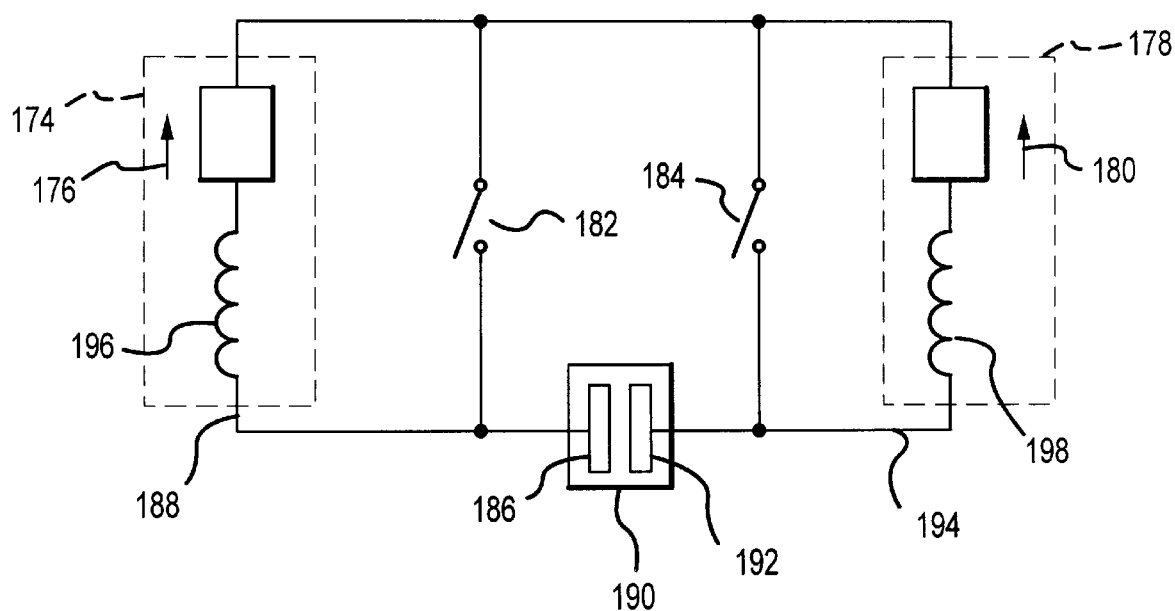
FIG. 20 is a schematic illustration of another embodiment of the present invention that utilizes two current controlled power sources.

FIG. 20 is a schematic circuit diagram of another embodiment of the present invention. As shown in FIG. 20, a current controlled power source 174 generates a substantially constant supply of direct current 176. An additional current controlled power source 178 generates a substantially constant supply of direct current 180. Switches 182 and 184 are connected in a shunt configuration with power source 174 and power source 178, respectively. A plasma chamber 190 is disposed in the circuit so that an electrode 186 is coupled to a common return 188 of power source 174. Electrode 192 is similarly connected to a common return 194 of power source 178. Power source 174 includes an inductor 196 that assists the power source 174 in functioning as an ideal current source. Similarly, inductor 198 of power source 178 assists the power source 178 in functioning as an ideal current source.

In operation, the embodiment of FIG. 20 has three different operating states. In a first operating state, switch 182 is closed and switch 184 is open. Direct current 176 from power source 174 is shunted to the common return 188 and does not pass through the plasma chamber 190. However, direct current 180 from power source 178 passes through switch 182 to electrode 186 in plasma chamber 190. The direct current 180 then passes through the plasma chamber 190 to electrode 192 to common return 194 of power source 178. Hence, the direct current 180 passes through the plasma chamber 190 in a first direction from electrode 186 to electrode 192.

Figure 21:
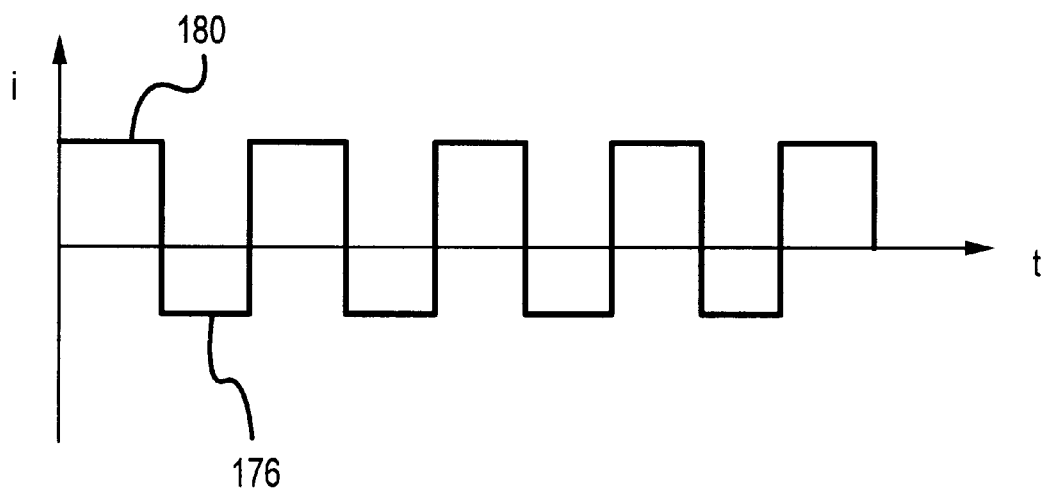
FIG. 21 is a schematic illustration of the current pulses that can be produced by the embodiment of FIG. 20.

FIG. 21 illustrates the flow of current through the plasma chamber 190. As shown in FIG. 21, in a first state of operation, the direct current 180 passes through the plasma chamber 190 for a predetermined period while switch 182 is closed and switch 184 is open. In a second state of operation, switch 182 is open and switch 184 is closed. Direct current 180 from power source 178 is shunted to the common return 194 of power source 178 and does not pass through the plasma of plasma chamber 190. However, direct current 176 of power source 174 flows through the switch 184 to electrode 192. Direct current 176 flows from electrode 192 to electrode 186 that is connected to common return 188 of power source 174. In this manner, direct current 176 passes through the plasma chamber 190 from electrode 192 to electrode 186. As FIG. 21 shows, a pulse of direct current 176 passes through the plasma chamber 190 during a predetermined period when switch 184 is closed and switch 182 is open. FIG. 21 also shows a manner in which the switches 182 and 184 can be alternately opened and closed to allow the direct current 180 and direct current 176 to alternately pass through the plasma chamber 190 in a periodic fashion. FIG. 21 additionally illustrates that direct current 176 and direct current 180 are not necessarily equal. Of course, these direct currents from power sources 174 and 178 can be generated at any desired magnitude that is consistent with the operation of the plasma chamber 190. FIG. 21 simply illustrates that the direct currents 176 and 180 need not necessarily be equal in magnitude.

Figure 22:
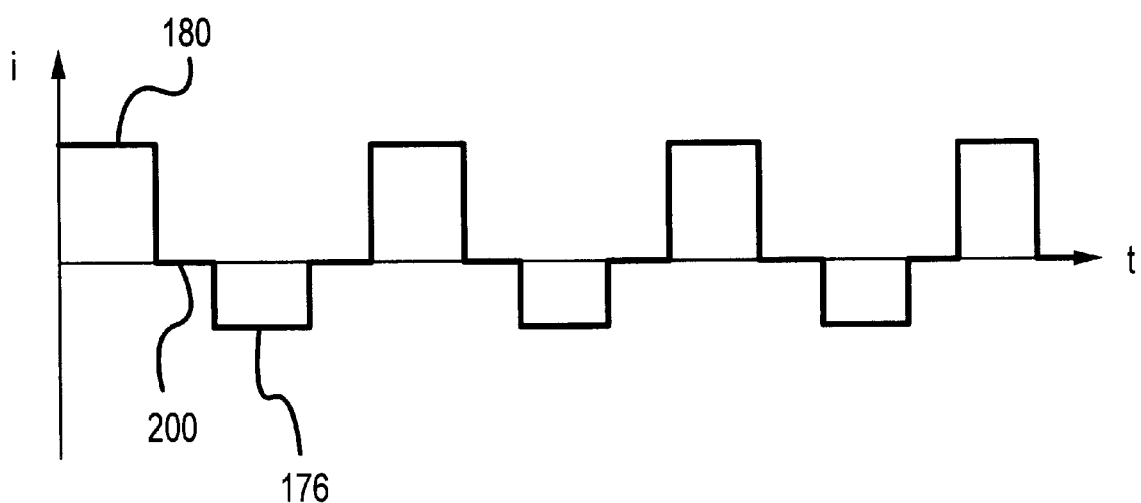
FIG. 22 is a schematic illustration of additional current pulses that can be produced by the embodiment of FIG. 20.

FIG. 22 schematically illustrates the manner in which switches 182 and 184 can also be operated in a third state. As shown in FIG. 22, direct current 180 passes through the plasma chamber when switch 182 is closed and switch 184 is open during a first state of operation. Both switches 182 and 184 can then be closed during a predetermined time period 200 so that no current passes through the plasma chamber 190 for example, whenever conditions are detected in the plasma chamber that could result in an arc discharge. Switch 182 can then be opened and switch 184 can remain closed so that direct current 176 passes through the plasma chamber 190, as illustrated in FIG. 22. These states can be periodically repeated, as shown in FIG. 22, to produce a predetermined duty cycle of pulses that are applied to the plasma chamber 190. Of course, any desired order of states can be applied by switching the switches 182 and 184 in the positions to produce the desired state of operation.

FIG. 23 illustrates another alternative embodiment of the present invention that utilizes three power sources. Each of the power sources has an associated shunt switch and electrode. For example, power source 202 has an associated shunt switch 208 and electrode 214 that are both coupled to the common return 216 of power source 202. Similarly, power source 204 has an associated shunt switch 210 and an electrode 218 that is connected to a common return 220 of power source 204. Power source 206 has an associated shunt switch 212 and electrode 222 that are connected to common return 224 of power source 206. Various states of operation can be generated employing the embodiment of FIG. 23 similar to the various states of operation of the embodiments of FIGS. 7–15 with the exception that separate currents can be generated by each of the power sources 202, 204 and 206. For example, in one state of operation, switch 208 is closed, while switches 210 and 212 are open. In that case, the substantially constant supply of direct current 226 is shunted through switch 208 to common return 216 so that the substantially constant supply of direct current 226 does not pass through the plasma chamber 232. However, the substantially constant supply of direct currents 228 and 230 from power sources 204 and 206, respectively, pass through switch 208 and are applied to electrode 214. Direct current 228 passes through plasma generated in the plasma chamber 232 from electrode 214 to electrode 218 to common return 220 of power source 204. In a similar manner, direct current 230 passes from electrode 214 through the plasma chamber 232 to electrode 222, and to the common return 224 of power source 206. As can be seen, various states of operation can be generated by opening and closing the switches 208, 210, and 212 at various predetermined times. Of course, if all of the switches are closed, no current passes through the plasma chamber 232.

FIG. 24 illustrates the manner in which four power sources 234, 236, 238, 240 can be employed with four shunt switches 242, 244, 246 and 248 and four associated electrodes 250, 252, 254 and 256, respectively. The embodiment of FIG. 24 can be operated in a manner similar to that disclosed with respect to the operation of the embodiment of FIG. 23. FIG. 24 also illustrates that any number of power supplies can be used in conjunction with a similar number of electrodes and shunt switches.

Figure 25:
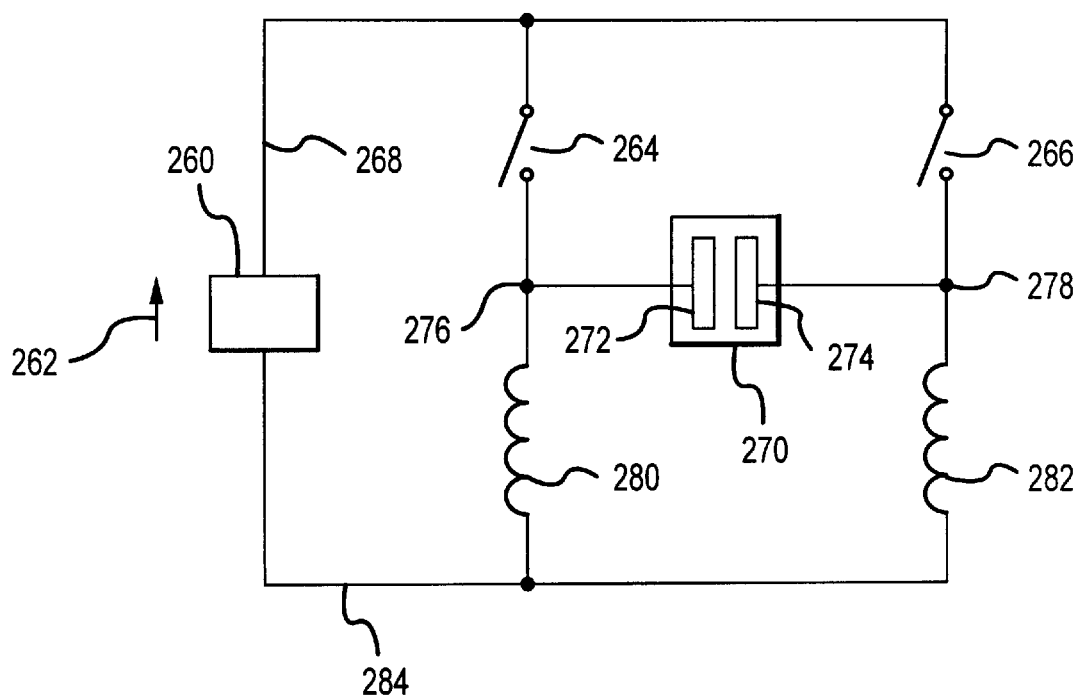
FIG. 25 is a schematic circuit diagram of another embodiment of the present invention that utilizes a single power source and two switches.

FIG. 25 is a schematic circuit diagram of another embodiment of the present invention. As illustrated in FIG. 25, a power source 260 generates a supply of a substantially constant direct current 262. Switches 264 and 266 are connected in parallel to the output 268 of the power source 260. A plasma chamber 270 having electrodes 272 and 274 is connected to nodes 276 and 278 that are, in turn, connected to switches 264 and 266, respectively. Inductors 280 and 282 are connected to nodes 276 and 278, and the common return 284 of power source 260.

In operation, the embodiment of FIG. 25 has several different states of operation. In startup mode, switch 264 may be closed while switch 266 is open. In this state of operation, current increases in inductor 280 for a predetermined period. In a second state of operation, during the startup phase, switch 264 is opened and switch 266 is simultaneously closed so that the direct current 262 flows to node 278. Inductor 280 attempts to draw some of the current 262 through the plasma chamber 270 from electrode 274 to electrode 272. Initially, inductor 282 provides a certain amount of impedance so that all of the current 262 cannot immediately flow through the inductor 282 when the switch 266 is first closed. These factors, in combination, cause the plasma to ignite under normal conditions so that a flow of current is established in the plasma chamber from electrode 274 to electrode 272. The current 262, however, increases on inductor 282 for a predetermined period. As the current increases on inductor 282, the current through plasma chamber 270 and inductor 280 decreases. Switch 266 is then opened and switch 264 is substantially simultaneously closed. At that point, current flows from electrode 272 to electrode 274 to maintain the current in inductor 282. In a similar manner, the current builds on inductor 280 while the current lessens on inductor 282 until the switches 264, 266 are switched again. Of course, both switches 264 and 266 can be closed to prevent the flow of current in the plasma chamber 270. Although the embodiment of FIG. 25 utilizes inductors 280 and 282 that have substantially equal inductances, it is possible that the embodiment of FIG. 25 can be operated with inductors that do not have the same impedance. Additionally, the operation of switches 264 and 266 is dependent upon the ramping time of current inductors 280 and 282, so that the switching period of switches 264 and 266, as well as the efficiency of the system, is dependent upon the magnitude of the inductance of inductors 280 and 282. With longer switching periods, the current flow in plasma chamber 270 may take the appearance of ramped pulses rather than square pulses.

FIG. 26 is a schematic illustration of another embodiment of the present invention that utilizes a single power source 286 that produces a substantially constant supply of direct current 288 that is applied to a plasma chamber 290 having three electrodes 292, 294 and 296. Three switches 298, 300 and 302 are coupled to the power source 286 for supplying the direct current 288 to electrodes 292, 294 and 296, as well as to inductors 304, 306 and 308, respectively. The embodiment of FIG. 26 operates in a manner similar to the embodiment of FIG. 25 by using the impedance of inductors 304, 306 and 308 to cause current to flow between the electrodes 292, 294 and 296 in plasma chamber 290.

FIG. 27 illustrates another alternative embodiment of the present invention that utilizes a single power sources 310 that generates a substantially constant supply of direct current 312 that is applied to a plasma chamber 314 that has four electrodes 316, 318, 320, 322. Switches 324, 326, 328 and 330 are connected to inductors 332, 334, 336 and 338, and electrodes 316, 318, 320 and 322, respectively, in a manner similar to that illustrated in FIG. 26. FIG. 27 illustrates that the number of electrodes in a plasma chamber 314 can be increased utilizing a single power source 310 by increasing the number of switches and inductors that are connected in the manner shown. The advantages associated with the use of multiple electrodes, as described above, can be realized with the embodiments of FIGS. 26 and 27 while employing only a single power source.

Figure 28:
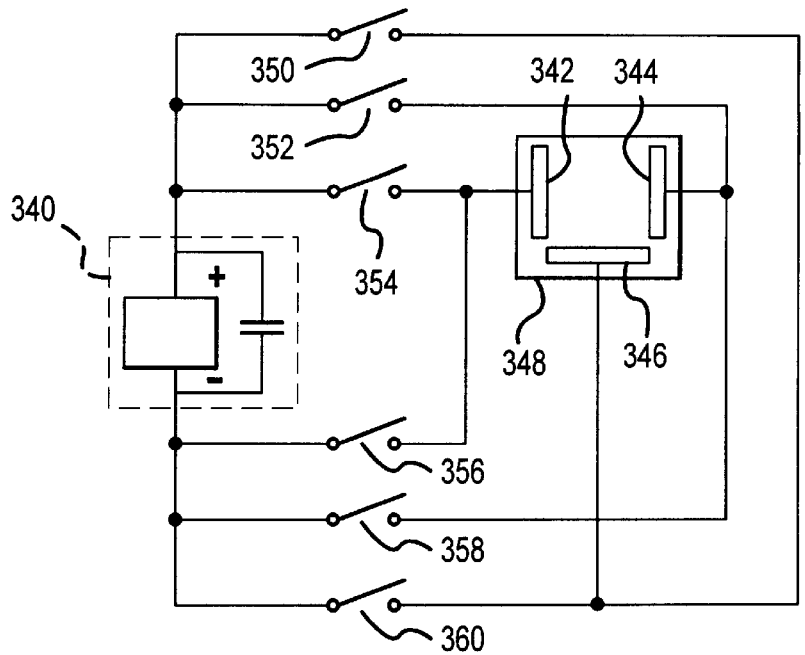
FIG. 28 is a schematic circuit diagram of a voltage controlled power source that is coupled to three electrodes.
Figure 29:
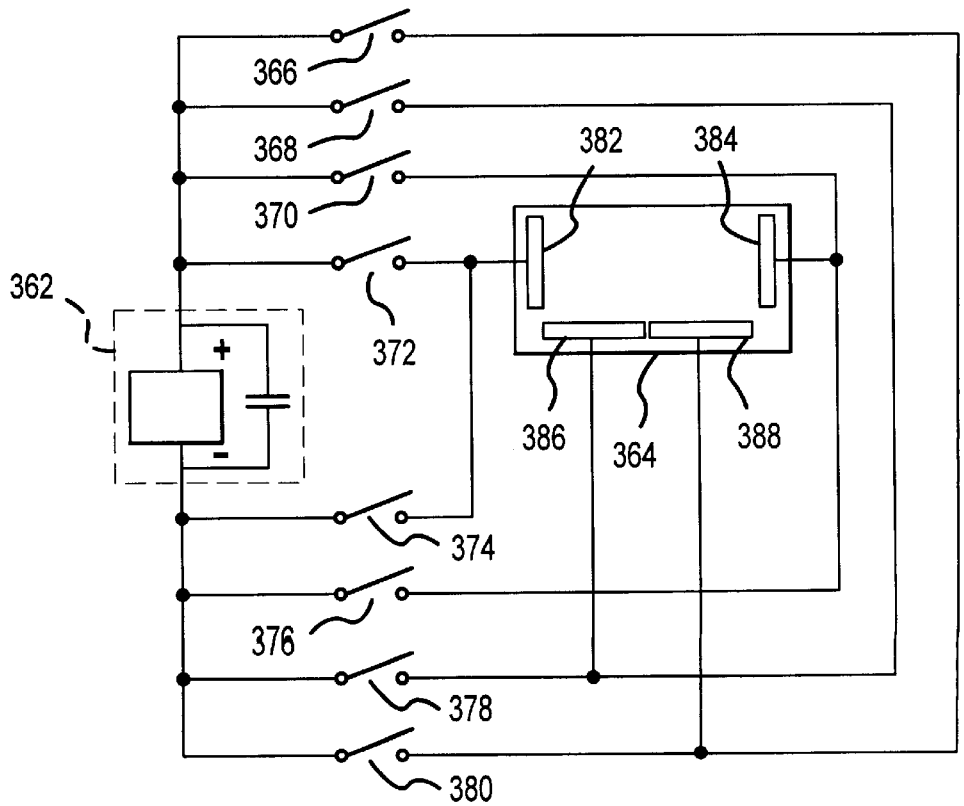
FIG. 29 is a schematic circuit diagram of a voltage controlled power source that is coupled to four electrodes.

FIG. 28 discloses another embodiment to the present invention that is similar to the embodiment of FIG. 6 with the exception that power source 340 comprises a voltage controlled power source. The embodiment of FIG. 28 operates in substantially the same manner as the embodiment of FIG. 6 with the exception that the power source 340 provides a substantially constant supply of voltage to electrodes 342, 344 and 346 of plasma chamber 348 by activation of switches 350, 352, 354, 356, 358, 360. As indicated with respect to FIG. 1, when the slope of the current verses voltage curve is less than 45 degrees, it may be advantageous to use a voltage controlled power source rather than a current controlled power source since incremental changes in the voltage will produce smaller incremental changes in the current. FIG. 29 illustrates the manner in which the number of electrodes in a plasma chamber 364 can be increased utilizing a single voltage controlled power source 362. The embodiment of FIG. 29 is similar to the embodiment of FIG. 19 with the exception that the power source 362 is a voltage controlled power source. The switches 366, 368, 370, 372, 374, 376, 378 and 380 can be operated to apply voltages to the various electrodes 382, 384, 386 and 388 to produce a plasma in plasma chamber 364.

The present invention therefore provides various embodiments for generating a plasma in a plasma chamber using current controlled power sources that are capable of accurately controlling the amount of current delivered to a plasma chamber. High temperature plasmas have low resistances such that slight changes in voltages cause large changes in the amount of current delivered to the plasma chamber. Excessive increases in current increase the susceptibility of arc discharges in the plasma chamber. Since the present invention utilizes a current controlled source in association with high temperature plasmas, the amount of current is regulated utilizing a power source that resembles a current source. The present invention encompasses embodiments employing a single power source with multiple electrodes in the plasma chamber, as well as embodiments including both multiple power sources an multiple electrodes. The present invention also encompasses various switching arrangements to produce various states of operation.

The foregoing discussion of the advantages of current sourcing relates to the short times involved in the pulsing operation and in arc formation, detection, and quenching. In reactive sputter deposition of certain oxides, the impedance of the plasma drops as the target sputtering region is encroached by oxide formation on the target. If, as is true for many materials, the oxide has a higher secondary emission coefficient than the metal itself, the plasma impedance will drop as the oxide encroaches. This is so because as ions strike the insulating surface, secondary electrons are emitted with will be pulled into the plasma and increase its density, lowering the target voltage to a given power level. This is another way of stating that the plasma impedance will drop. Thus, if the power supply is set up to hold the voltage constant on the target, the power (and therefore the sputtering rate) will increase as the voltage drops. This will increase the metal available to react with the background gas, and inhibit to some extent the encroachment of insulator on the sputter area. Inhibiting the encroachment will make the process more stable and easier to control.

To be effective as a stabilizing approach, the holding of the voltage constant must be on the time scale of the chemical reactions of the background oxygen (or other reactive gas) with the target and the deposited film, which is measured in milliseconds. The requirement to be current sourced is on a time scale of the arcs and the pulsing, which is measured in microseconds. That is, the power source should appear to be a constant current source for the interpulse period. To permit this duality of control, one must set up a current-sourced power supply to be voltage regulated, which means that the value of the instantaneous current is to be continuously adjusted by the regulation loops of the power supply to maintain the voltage constant on a millisecond time scale. By this means, on a short time scale, measured in microseconds, the current is held constant, while on a longer time scale, measured in milliseconds, the power supply appears to hold the voltage constant. Additionally, the use of multiple electrodes in association with a single voltage controlled power source is an alternative embodiment of the present invention that may provide advantages in low temperature plasma processes.

The foregoing description of the invention has been presented for purposes of illustration and description. It is not intended to be exhaustive or to limit the invention to the precise from disclosed and other modifications and variations may be possible in light of the above teachings. For example, various embodiments disclosed in the present application may be utilized with a voltage controlled power source which may have advantages in low resistance plasma applications. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A circuit that causes at least two substantially constant currents to flow to at least two electrodes in a plasma chamber, comprising:
   a first power source that generates a substantially constant supply of a first direct current, said first power source having an output lead coupled to a first electrode, and a common return lead coupled to a circuit common;
   a second power source that generates a substantially constant supply of a second direct current, said second power source having an output lead coupled to a second electrode and a common return lead coupled to a circuit common;

a first switch coupled between said first electrode and said circuit common that, when closed, causes current to flow from said second power source through said plasma chamber from said second electrode to said first electrode and shunts current from said first power source to said circuit common;

a second switch coupled between said second electrode and said circuit common that, when closed, causes current to flow from said first power source in a second direction through said plasma chamber from said first electrode to said second electrode, and shunts current from said second power source to said circuit common.

2. The circuit of claim 1 wherein:

at least one of said power sources includes a series connected inductor.

3. The circuit of claim 1 wherein said first direct current and said second direct current are not equal.

4. A circuit for causing two substantially constant direct currents to flow in a plasma chamber comprising:

a first current controlled power source coupled to said plasma chamber that generates a first substantially constant direct current;

a second current controlled power source coupled to said plasma chamber that generates a second substantially constant direct current;

a first switch that causes current from said second current controlled power source to flow through said plasma chamber in a first direction when closed;

a second switch that causes current from said first current controlled power source to flow through said plasma in a second direction when closed.

5. The circuit of claim 4 wherein:

said first current controlled power source includes a series connected inductor;

said second current controlled power source includes a series connected inductor.

6. The circuit of claim 4 further comprising:

at least on additional current controlled power source that generates at least one additional substantially constant direct current;

an additional switch associated with each additional current controlled power source that causes current from other current controlled power sources to flow through said plasma chamber in an additional direction.

7. A method for causing two substantially constant direct currents to flow in a plasma chamber comprising the steps of:

generating a first substantially constant direct current using a first current controlled power source;

generating a second substantially constant direct current using a second current controlled power source;

connecting said first current controlled power source to said plasma chamber to cause said first substantially constant direct current to flow through said plasma chamber in a first direction during a first state of operation;

connecting said second current controlled power source to said plasma chamber to cause said second substantially constant direct current to flow through said plasma chamber in a second direction during a second state of operation.

8. The method of claim 7 wherein said steps of generating first and second substantially constant direct currents comprises generating first and second substantially constant direct currents that are not equal in magnitude.

9. The method of claim 7 further comprising the step of:

shunting said first and second substantially constant direct current from said first and second current controlled power sources to a common return so that no current passes through said plasma chamber whenever conditions are detected in said plasma chamber that could result in an arc discharge.

\* \* \* \* \*